(12) United States Patent
Peidous et al.

(10) Patent No.: US 7,696,534 B2
(45) Date of Patent: Apr. 13, 2010

(54) STRESSED MOS DEVICE

(75) Inventors: Igor Peidous, Fishkill, NY (US); Linda R. Black, Wappingers Falls, NY (US); Frank Wirbeleit, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/166,166

(22) Filed: Jul. 1, 2008

(65) Prior Publication Data

US 2008/0258175 A1   Oct. 23, 2008

Related U.S. Application Data

(62) Division of application No. 11/269,241, filed on Nov. 7, 2005, now Pat. No. 7,410,859.

(51) Int. Cl.
*H01L 29/74* (2006.01)

(52) U.S. Cl. .................. 257/190; 257/E29.246

(58) Field of Classification Search .......... 257/190, 257/627, 628, E29.246, E29.02, E29.052, 257/E29.286

See application file for complete search history.

(56) References Cited

U.S. PATENT DOCUMENTS

| 4,925,805 | A | 5/1990 | van Ommen et al. |
| 2003/0057438 | A1 | 3/2003 | Yu et al. |
| 2004/0150076 | A1 | 8/2004 | Ramdani et al. |
| 2004/0151463 | A1 | 8/2004 | Talin et al. |
| 2004/0227186 | A1 | 11/2004 | Saito et al. |
| 2006/0001018 | A1 | 1/2006 | Chow et al. |
| 2007/0026593 | A1 | 2/2007 | Jawarani et al. |
| 2007/0072380 | A1 | 3/2007 | Wirbeleit et al. |

*Primary Examiner*—Walter L Lindsay, Jr.
(74) *Attorney, Agent, or Firm*—Ingrassia Fisher & Lorenz, P.C.

(57) ABSTRACT

A stressed MOS device is provided that includes a silicon substrate, a gate electrode and an epitaxial layer of stress inducing monocrystalline semiconductor material. The silicon substrate is characterized by a monocrystalline silicon lattice constant. The gate electrode overlies a silicon channel region at the surface of the silicon substrate. The epitaxial layer of stress inducing monocrystalline semiconductor material is grown in the silicon substrate. The epitaxial layer of stress inducing monocrystalline semiconductor material has a lattice constant greater than the monocrystalline silicon lattice constant, and extends under the silicon channel region.

14 Claims, 3 Drawing Sheets

STRESSED MOS DEVICE

CROSS-REFERENCE TO RELATED APPLICATION

This is a divisional application of U.S. patent application Ser. No. 11/269,241, filed Nov. 7, 2005.

TECHNICAL FIELD

The present invention generally relates to stressed MOS devices, and more particularly relates to stressed NMOS and CMOS devices.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain electrodes between which a current can flow. A control voltage applied to the gate electrode controls the flow of current through a channel between the source and drain electrodes.

MOS transistors, in contrast to bipolar transistor, are majority carrier devices. The gain of an MOS transistor, usually defined by the transconductance ($g_m$), is proportional to the mobility of the majority carrier in the transistor channel. The current carrying capability and hence the performance of an MOS transistor is proportional to the mobility of the majority carrier in the channel. The mobility of holes, the majority carrier in a P-channel MOS (PMOS) transistor can be increased by applying a compressive longitudinal stress to the channel. It is well known that a compressive longitudinal stress can be applied to a silicon MOS transistor by embedding a material such as silicon germanium (SiGe) at the ends of the transistor channel. The mobility of electrons, the majority carrier in an N-channel MOS (NMOS) transistor, however, is decreased by such a compressive longitudinal stress to the channel. To increase the mobility of electrons, a tensile stress must be applied to the channel of the MOS transistor.

Accordingly, it is desirable to provide an NMOS transistor having enhanced majority carrier mobility. In addition, it is desirable to provide a method of fabricating an NMOS transistor having enhanced majority carrier mobility. It is also desirable to provide a CMOS device and a method for its fabrication wherein both the NMOS and PMOS transistors have enhanced majority carrier mobility. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment of the invention, a stressed MOS device is provided that includes a silicon substrate, a gate electrode and an epitaxial layer of stress inducing monocrystalline semiconductor material. The silicon substrate is characterized by a monocrystalline silicon lattice constant. The gate electrode overlies a silicon channel region at the surface of the silicon substrate. The epitaxial layer of stress inducing monocrystalline semiconductor material is grown in the silicon substrate. The epitaxial layer of stress inducing monocrystalline semiconductor material has a lattice constant greater than the monocrystalline silicon lattice constant, and extends under the silicon channel region.

In accordance with another embodiment of the invention a stressed NMOS device having enhanced mobility is provided. The NMOS device comprises a substrate having a surface, the substrate comprising a monocrystalline semiconductor material having a first lattice constant. A channel region is formed of that monocrystalline silicon material adjacent the surface. A stress inducing monocrystalline semiconductor material having a second lattice constant greater than the first lattice constant is grown under the channel region to exert a horizontal biaxial tensile stress on the channel region. In accordance with one embodiment the NMOS device can be integrated into a CMOS device and even a CMOS device including an enhanced mobility PMOS device.

BRIEF DESCRIPTION OF THE DRAWINGS

The present invention will hereinafter be described in conjunction with the following drawing figures, wherein like numerals denote like elements, and wherein FIGS. 1-9 schematically illustrate a stressed MOS device and methods for its fabrication in accordance with various embodiments of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-9 illustrate a stressed MOS device 30 and method steps for manufacturing such an MOS device in accordance with various embodiments of the invention. In this illustrative embodiment stressed MOS device 30 is a CMOS device here illustrated by a single NMOS transistor 31 and a single PMOS transistor 33. As will become clear from the following description, the various embodiments of the invention are particularly directed to the enhancement of the mobility of electrons in the channel of an NMOS transistor. In accordance with one embodiment of the invention, however, an NMOS transistor having enhanced mobility is fabricated together with a PMOS transistor that also has enhanced mobility to achieve a CMOS device having superior characteristics. Those of skill in the art will recognize that the invention can be applied to either single channel NMOS devices or to CMOS devices. An integrated circuit formed from stressed MOS devices such as device 30 can include a large number of such transistors, and may include both stressed and unstressed P-channel MOS transistors and stressed and unstressed N-channel transistors.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
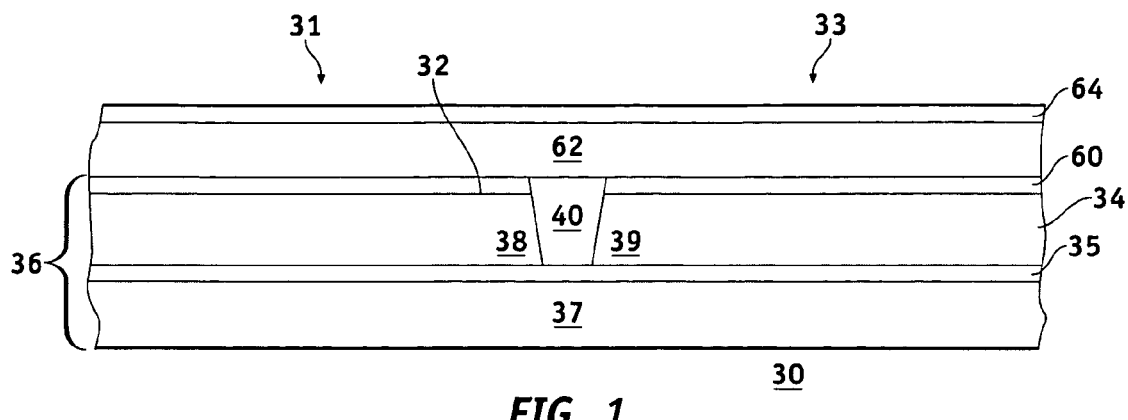
FIGS. 1 and 3-9 illustrate the fabrication of the stressed MOS device in cross sectional views.
Figure 2:
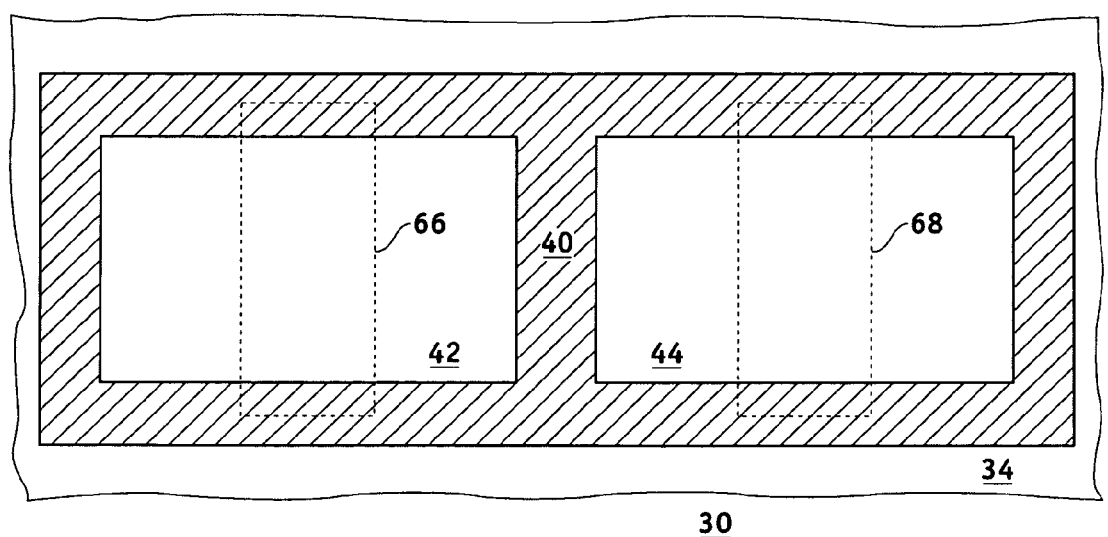
FIG. 2 illustrates a top view of the device in accordance with an embodiment of the invention.

As illustrated in cross section in FIG. 1, the manufacture of stressed MOS device 30, in accordance with an embodiment of the invention, begins with providing a semiconductor substrate 36 having a surface 32. The semiconductor substrate can be any monocrystalline semiconductor material, but is preferably a monocrystalline silicon substrate wherein the term "silicon substrate" is used herein to encompass the relatively pure silicon materials typically used in the semiconductor industry. Semiconductor substrate 36 will herein be referred to, for ease of discussion but without limitation, as a silicon substrate. Those of skill in the art will recognize that semiconductor substrate 36 can also be formed of other semiconductor materials. Whether formed of monocrystalline silicon or some other monocrystalline semiconductor material, the monocrystalline material forming substrate 36 will be characterized by a lattice constant associated with the crystalline structure of that material. Silicon substrate 36 may be a bulk silicon wafer or a thin layer of silicon 34 on an insulating layer 35 (commonly know as silicon-on-insulator or SOI) that, in turn, is supported by a silicon carrier wafer 37, but preferably, as here illustrated, without limitation, is an SOI wafer. To fabricate a CMOS device, portions of thin silicon layer 34 will be doped with P-type impurity dopants (a P-well 38) for the fabrication of N-channel MOS transistors and other portions will be doped with N-type impurity dopants (an N-well 39) for the fabrication of P-channel MOS transistors. The P-well and N-well can be doped to the appropriate conductivity, for example, by ion implantation. Shallow trench isolation (STI) 40 or other form of electrical isolation is formed in the semiconductor substrate and preferably extends through thin layer of silicon 34 to insulating layer 35 to electrically isolate individual devices as required by the circuit function being implemented. As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material the surface is usually planarized, for example by chemical mechanical planarization (CMP). In this exemplary embodiment, as illustrated in top view in FIG. 2, the STI is merely shown as a rectangular "window frame" of insulating material that surrounds a P-type active area 42 and an N-type active area 44 of silicon substrate 36.

With reference again to FIG. 1, a layer of gate insulator 60 is formed on the surface of thin silicon layer 34. The gate insulator may be a thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), or plasma enhanced chemical vapor deposition (PECVD). As illustrated in FIG. 1, gate insulator 60 is a thermally grown silicon dioxide that grows only on the silicon layer. The gate insulator material is typically 1-10 nanometers (nm) in thickness. In accordance with one embodiment of the invention a layer of conductive material 62 such as polycrystalline silicon or metal, and preferably polycrystalline silicon, is deposited onto the layer of gate insulator. The layer of polycrystalline silicon is preferably deposited as undoped polycrystalline silicon and is subsequently impurity doped by ion implantation. The polycrystalline material can be deposited, for example, to a thickness of about 110 nm by LPCVD by the hydrogen reduction of silane. A layer 64 of hard mask material such as silicon oxide, silicon nitride, or silicon oxynitride can be deposited onto the surface of the polycrystalline silicon. The hard mask material can be deposited to a thickness of about 50 nm, also by LPCVD.

Figure 3:
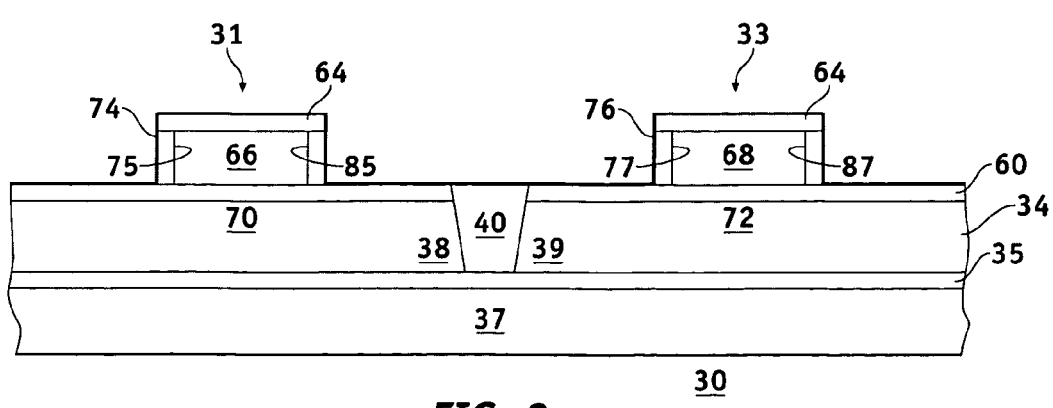

The layer of polycrystalline silicon 62 and the layer of hard mask material 64 are photolithographically patterned to form MOS transistor gate electrodes 66 and 68 as illustrated in cross section in FIG. 3. The gate electrodes are also illustrated, with dashed lines, in FIG. 2. Gate electrode 66 overlies the portion of P-type active area 42 and P-well 38 of thin silicon layer 34 that will form channel 70 of NMOS transistor 31 at surface 32. In similar manner gate electrode 68 overlies the portion of N-type active area 44 and N-well 39 that will form the channel 72 of PMOS transistor 33, also at surface 32. The polycrystalline silicon can be etched in the desired pattern by, for example, plasma etching in a Cl or HBr/$O_2$ chemistry and the hard mask can be etched, for example, by plasma etching in a $CHF_3$, $CF_4$, or $SF_6$ chemistry. Following the patterning of the gate electrode, in accordance with one embodiment of the invention, a thin layer 74 of silicon oxide is thermally grown on the opposing sidewalls 75 and 85 of gate electrode 66 and a thin layer 76 of silicon oxide is thermally grown on the opposing sidewalls 77 and 87 of gate electrode 68 by heating the polycrystalline silicon in an oxidizing ambient. Layers 74 and 76 can be grown to a thickness of about 2-5 nm. Gate electrodes 66 and 68 and layers 74 and 76 can be used as an ion implantation mask to form source and drain extensions (not illustrated) on either or both of the MOS transistors. The possible need for and method of forming multiple source and drain regions are well known, but are not germane to this invention and hence need not be explained herein.

Figure 4:
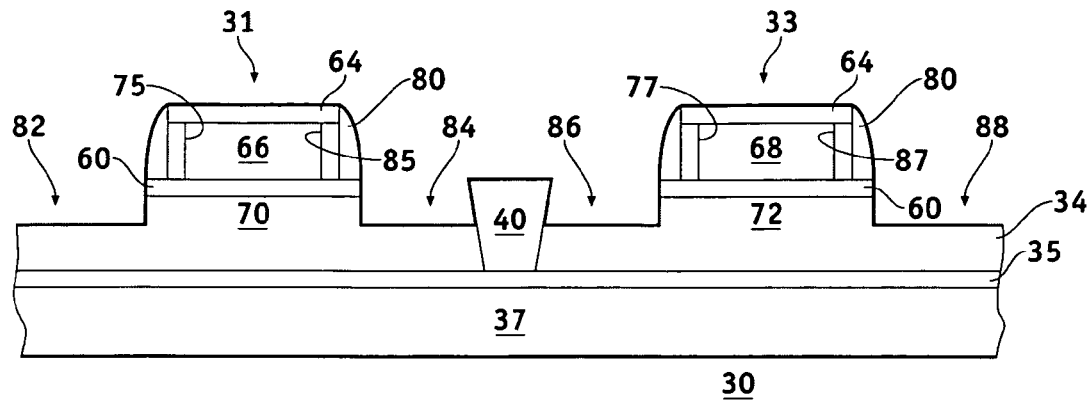

In accordance with one embodiment of the invention, as illustrated in FIG. 4, sidewall spacers 80 are formed on the thin oxide layer on the opposing sidewalls 75, 85 and 77, 87 of gate electrodes 66 and 68, respectively. The sidewall spacers can be formed of silicon nitride, silicon oxide, or the like by depositing a layer of the spacer material over the gate electrodes and subsequently anisotropically etching the layer, for example by reactive ion etching using a $CHF_3$, $CF_4$, or $SF_6$ chemistry. Sidewall spacers 80, gate electrodes 66 and 68, the hard mask on the top of the gate electrodes, and STI 40 are used as an etch mask to etch initial recesses 82 and 84 in the silicon substrate in spaced apart self alignment with the opposing edges of N-channel gate electrode 66 and to etch recesses 86 and 88 in spaced apart self alignment with the opposing edges of P-channel gate electrode 68. The recesses intersect the ends of the channels 70 and 72. The recesses are anisotropically etched, for example by reactive ion etching using a HBr/$O_2$ and Cl chemistry. Preferably each of the recesses has a depth or about 0.04-0.1 μm.

Figure 5:
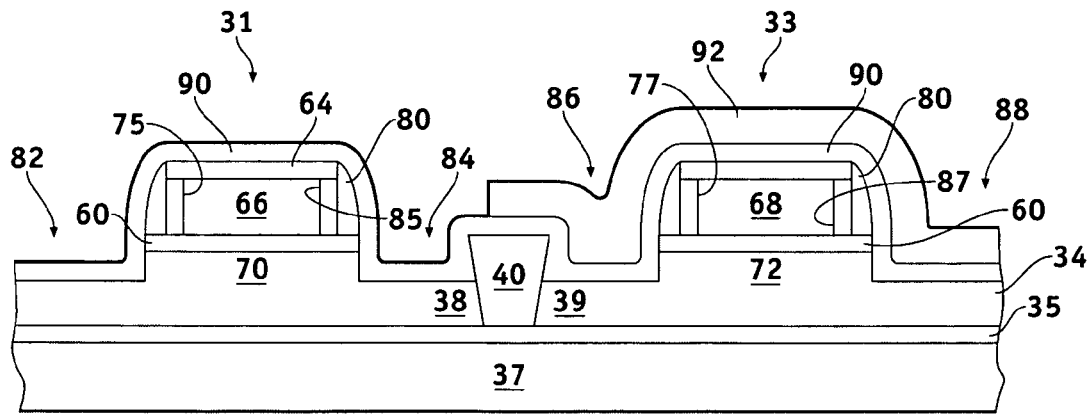

The method in accordance with an embodiment of the invention continues, as illustrated in FIG. 5, by depositing another layer of spacer forming material 90. A layer of photoresist 92 is applied over the layer of spacer forming material and is patterned to leave the layer of photoresist protecting PMOS transistor 33 and exposing NMOS transistor 31. As before, the spacer forming material can be silicon nitride, silicon oxide, or the like deposited by, for example, LPCVD.

Figure 6:
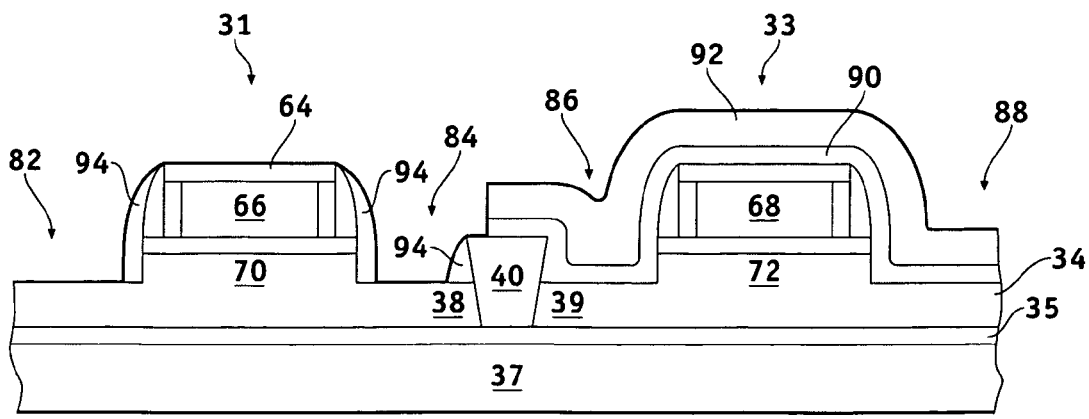

As illustrated in FIG. 6, the exposed portion of layer of spacer forming material 90 is anisotropically etched to form sidewall spacers 94 on the vertical edges of initial recesses 82 and 84. The anisotropic etching of the layer of spacer forming material exposes the bottoms of initial recesses 82 and 84.

Figure 7:
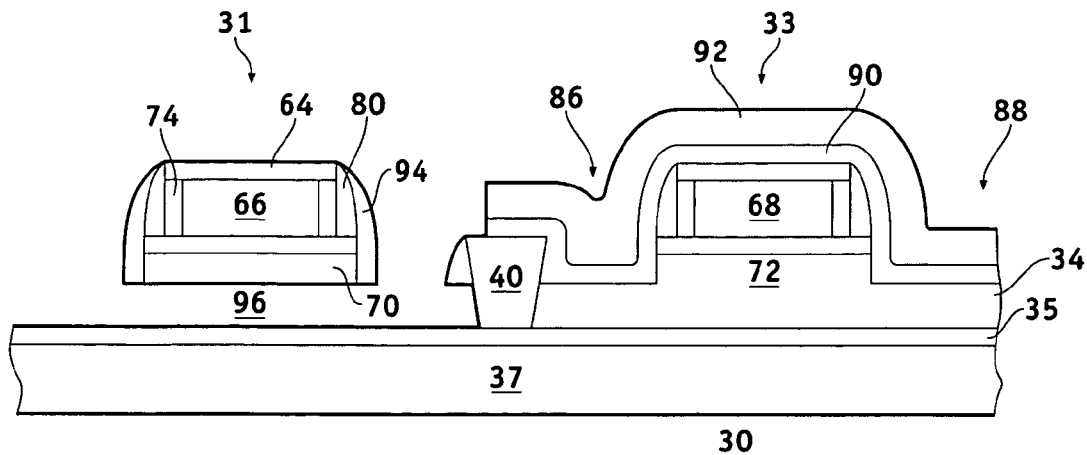
Figure 8:
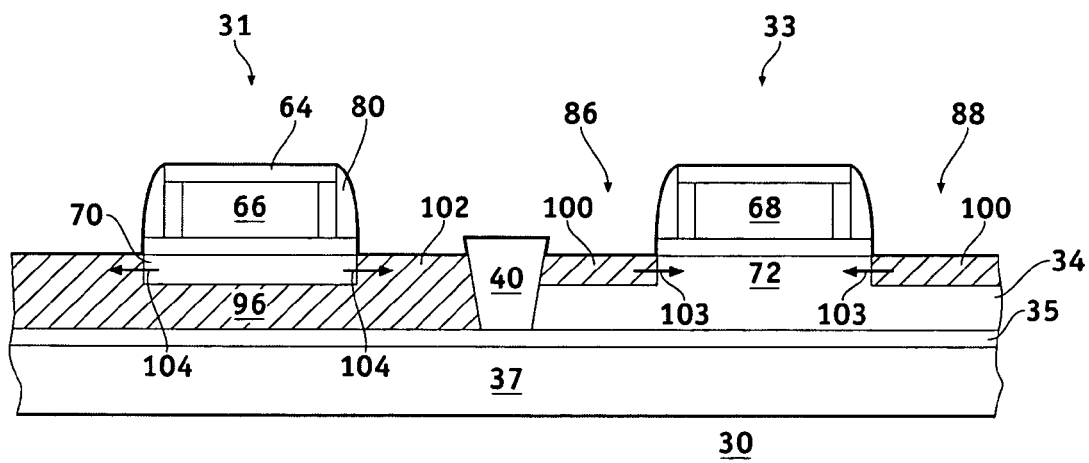

As illustrated in FIG. 7, the exposed bottoms of the initial recesses are isotropically etched for example by plasma etching using a $Cl_2$/$SF_6$ chemistry. The isotropic etching increases the depth of the initial recesses and also etches sideways under channel region 70. The etching preferably continues until a recess 96 extends completely under channel region 70. If semiconductor substrate 36 is an SOI substrate, recess 96 preferably extends through the thickness of thin layer of silicon 34 to insulating layer 35. During the etching of recess 96 sidewall spacers 94 prevent the etching of the semiconductor material forming channel region 70. Channel region 70 thus remains as a bridge of semiconductor material overlying recess 96 and extending from the STI on one side of the active region to the STI on the other side of the active region.

Following the etching of recess 96, the method in accordance with one embodiment of the invention continues by removing photoresist layer 92, sidewall spacers 94, and the remainder of layer 90. A layer of stress inducing semiconductor material 100, 102 having a lattice constant greater than the lattice constant of the host thin silicon layer 34 is selectively epitaxially grown to fill recesses 86, 88, and 96 as illustrated in cross section in FIG. 8. For a host silicon material, the layer of stress inducing semiconductor material can be, for example, silicon germanium (SiGe) having about 10-30 atomic percent germanium. The SiGe has a greater lattice constant than silicon. In general, the layer of stress inducing semiconductor material can be any pseudomorphic material that can be epitaxially grown on the semiconductor substrate with a lattice constant greater than the lattice constant of the host semiconductor material. The epitaxial growth of layer 100 nucleates on the walls and bottom of recesses 86 and 88. The epitaxial growth of layer 102 nucleates on the bottom of channel region 70, creating the desired stress on channel region 70. Methods for epitaxially growing SiGe and other stress inducing materials on a silicon or other semiconductor host in a selective manner are will known and need not be described herein. The epitaxial growth is continued until recesses 86, 88, and 96 are filled. Because SiGe has a greater lattice constant than silicon, layer 100 exerts a compressive longitudinal stress as indicated by arrows 103 on channel region 72 of PMOS transistor 33. Such a compressive longitudinal stress increases the mobility of majority carrier holes in the channel of the PMOS transistor. Because of the greater lattice constant of SiGe, layer 102 applies a horizontal tensile force on the silicon of channel region 70 of NMOS transistor 31. The horizontal tensile force applies a horizontal tensile stress indicated by arrow 104 on channel region 70. The tensile stress increases the mobility of the majority carrier electrons in the NMOS transistor. Advantageously, in accordance with this embodiment of the invention, the same selective epitaxial growth step produces the appropriate stresses in both NMOS transistor 31 and PMOS transistor 33.

Figure 9:
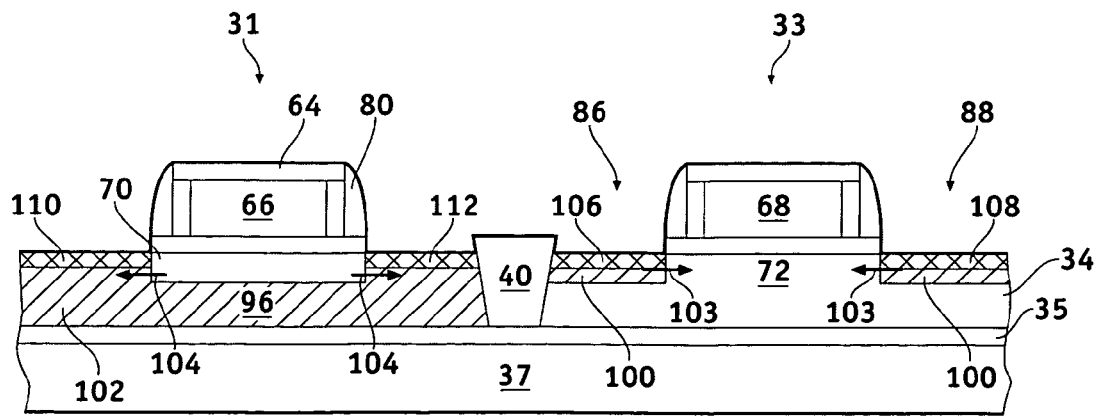

Source and drain regions of the MOS transistors can be partially or completely in-situ doped with conductivity determining impurities during the process of selective epitaxial growth. Otherwise, following the growth of the stress inducing material in recesses 86, 88, and 96, P-type conductivity determining ions are implanted into the stress inducing material in recesses 86 and 88 to form a source region 106 and a drain region 108 of PMOS transistor 33 as illustrated in FIG. 9. Similarly, N-type conductivity determining ions are implanted into the stress inducing material in recess 96 to form a source region 110 and a drain region 112 of NMOS transistor 31. Appropriate masking, for example with layers of patterned photoresist, can be used in the conventional manner to mask NMOS transistor 31 during the implanting of the P-channel source and drain regions and to mask PMOS transistor 33 during the implanting of the N-channel source and drain regions.

Stressed MOS device 30 can be completed by well known steps (not illustrated) such as depositing a layer of dielectric material, etching opening through the dielectric material to expose portions of the source and drain regions, and forming metallization that extends through the openings to electrically contact the source and drain regions. Further layers of interlayer dielectric material, additional layers of interconnect metallization, and the like may also be applied and patterned to achiever the proper circuit function of the integrated circuit being implemented.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A stressed MOS transistor comprising:
   a substrate having a surface, the substrate comprising a monocrystalline semiconductor material having a first lattice constant;
   a channel region formed of the monocrystalline silicon material adjacent the surface; and
   a stress inducing monocrystalline semiconductor material having a second lattice constant greater than the first lattice constant grown under the channel region and exerting a horizontal tensile stress on the channel region.

2. The stressed MOS transistor of claim 1, further comprising:
   a recess extending from the surface into the substrate and under the channel region, wherein the stress inducing monocrystalline semiconductor material fills the recess.

3. The stressed MOS transistor of claim 1, wherein the substrate comprises monocrystalline silicon, and wherein the stress inducing monocrystalline semiconductor material comprises an epitaxial layer of SiGe.

4. The stressed MOS transistor of claim 1, further comprising:
   a gate electrode overlying the monocrystalline semiconductor substrate, the gate electrode having a first edge and a second edge;
   a source region comprising a first recess aligned with the first edge and filled with the stress inducing monocrystalline semiconductor material;
   a drain region comprising a second recess aligned with the second edge and filled with the stress inducing monocrystalline semiconductor material; and
   a third recess extending beneath the channel region between the source region and the drain region, the third recess being filled with the stress inducing monocrystalline semiconductor material.

5. The stressed MOS transistor of claim 4, wherein the monocrystalline semiconductor substrate comprises a silicon on insulator substrate comprising a thin layer of silicon on an insulator, wherein the third recess is formed in the thin silicon layer and extends from the channel region to the insulator.

6. The stressed MOS transistor of claim 4, wherein each of the first recess and the second recess have sidewalls and have a depth equal to an initial first depth, and further comprising:
   sidewall spacers on the sidewalls of the first recess and the second recess.

7. A stressed MOS device, comprising:
   a silicon substrate characterized by a monocrystalline silicon lattice constant;
   a gate electrode overlying a silicon channel region at the surface of the silicon substrate; and an epitaxial layer of stress inducing monocrystalline semiconductor material in the silicon substrate extending under the silicon channel region, the stress inducing monocrystalline semiconductor material having a lattice constant greater than the monocrystalline silicon lattice constant.

8. The stressed MOS device of claim 7, wherein the epitaxial layer of stress inducing monocrystalline semiconductor material comprises a monocrystalline layer of SiGe.

9. The stressed MOS device of claim 7, further comprising:
a source region comprising a first recess in the silicon substrate, the source region filled with the stress inducing monocrystalline semiconductor material; and
a drain region comprising a second recess in the silicon substrate, the drain region filled with the stress inducing monocrystalline semiconductor material, wherein the stress inducing monocrystalline semiconductor material in the silicon substrate extends under the silicon channel region between the source region and the drain region.

10. A stressed MOS device, comprising:
a silicon substrate comprising an N-type region and a P-type region, the P-type region including a channel region;
a first gate electrode overlying the N-type region;
first recesses in the silicon substrate in alignment with the first gate electrode;
a second gate electrode overlying the P-type region, the second gate electrode overlying the channel region; and
second recesses in the silicon substrate in alignment with the second gate electrode, wherein the second recesses extend under the channel region; and
a layer of a monocrystalline stress inducing semiconductor material that fills the first recesses and the second recesses.

11. The stressed MOS device of claim 10, wherein the layer of monocrystalline stress inducing semiconductor material comprises a monocrystalline layer of SiGe.

12. The stressed MOS device of claim 10, wherein the layer of monocrystalline stress inducing semiconductor material in the first recess is doped with P-type conductivity determining ions, and wherein the layer of monocrystalline stress inducing semiconductor material in the second recess is doped with N-type conductivity determining ions.

13. The stressed MOS device of claim 10, wherein each of the first recess and the second recess have sidewalls and have a depth equal to an initial first depth, and further comprising:
sidewall spacers on the sidewalls of the first recess and the second recess.

14. The stressed MOS device of claim 10, wherein the layer of monocrystalline stress inducing semiconductor material comprises an epitaxial layer of semiconductor material having a lattice constant greater than the lattice constant of monocrystalline silicon.

* * * * *